United States Patent
Doumae

(10) Patent No.: US 7,531,880 B2
(45) Date of Patent: May 12, 2009

(54) SEMICONDUCTOR DEVICE AND MANUFACTURING METHOD THEREOF

(75) Inventor: Yasuhiro Doumae, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/040,072

(22) Filed: Feb. 29, 2008

(65) Prior Publication Data

US 2008/0237713 A1 Oct. 2, 2008

(30) Foreign Application Priority Data

Mar. 30, 2007 (JP) .............................. 2007-091687

(51) Int. Cl.
 *H01L 29/76* (2006.01)
 *H01L 29/94* (2006.01)
 *H01L 31/062* (2006.01)
 *H01L 31/113* (2006.01)
 *H01L 31/119* (2006.01)

(52) U.S. Cl. ........................ 257/368; 257/369; 257/401; 257/E27.06; 257/E27.062

(58) Field of Classification Search ................ 257/337, 257/338, 368, 369, 386, 401, E27.06, E27.062
See application file for complete search history.

(56) References Cited

U.S. PATENT DOCUMENTS 6,392,278 B1 * 5/2002 Kimura ....................... 257/401

FOREIGN PATENT DOCUMENTS

JP 2003174172 6/2003

* cited by examiner

*Primary Examiner*—Hoai V Pham
(74) *Attorney, Agent, or Firm*—Volentine & Whitt, P.L.L.C.

(57) ABSTRACT

A device includes a semiconductor layer on an insulating layer; a gate insulator on the semiconductor layer; a comb-shaped gate electrode on the gate insulator, including a base portion extending in a first direction and tooth portions extending in a second direction from one side surface of the base portion; a comb-shaped low-concentration diffusion layer in the semiconductor layer under the gate electrode having a first electroconductive type; a source layer in the semiconductor layer on the tooth portion side of the base portion having second electroconductive type with high concentration; a drain layer in the semiconductor layer on a side of the base portion opposite the tooth portion side having second electroconductive type with high concentration; and an extraction layer in the semiconductor layer between the source and the device isolating layers having first electroconductive type with high concentration, and connected with the diffusion layer.

5 Claims, 7 Drawing Sheets

GATE LENGTH DIRECTION

SEMICONDUCTOR DEVICE AND MANUFACTURING METHOD THEREOF

BACKGROUND OF THE INVENTION

1. Field of the Invention

The present invention generally relates to a semiconductor device which is formed on an SOI (Silicon On Insulator) substrate and has a source-tie structure.

2. Description of the Related Art

A semiconductor device such as an nMOS (Metal Oxide Semiconductor) device or a pMOS device formed on an SOI substrate includes a semiconductor layer of thin silicon (Si) formed on a silicon substrate, with a buried oxide film (an insulating layer) interposed between the semiconductor layer and the silicon substrate. Since the semiconductor layer is surrounded by a device isolating layer, a channel region of the device is in a floating state. Therefore, carriers are produced responsive to impact ions at a drain end of a channel region of the device, and the carriers function as a base current that turns on a parasitic diode. In the case of an nMOS device the carriers are holes, and in the case of a pMOS device the carriers are electrons. In drain current (Id)–gate voltage (Vg) characteristics, when a drain voltage (Vd) is increased, an S factor (Subthreshold swing S) is reduced to be smaller than a theoretical value. As a result, the carriers produced responsive to a single latch-up phenomenon that a threshold voltage (Vth) is precipitously reduced, and to impact ionization at the drain end. The carriers are stored in the channel region, and a potential in the channel region fluctuates. Given the situation, in Id–Vd characteristics, a drain current is precipitously increased in a region where a drain voltage is high. This is called a kink phenomenon. For more details, a substrate floating effect such a kink phenomenon usually occurs in the region where a drain voltage is high.

Furthermore, in an analog circuit using a gate voltage which is approximately 1 V higher than a threshold voltage, since operation when a change in a drain current with respect to a drain voltage is large is a problem, a further increase in the drain current due to the kink phenomenon becomes an even greater problem in particular.

Extracting the carriers stored in the channel region by use of a body-tie structure or a source-tie structure is effective to suppress the substrate floating effect. However, in a body-tie structure as shown in FIGS. 5 and 10 of Japanese Patent Application Laid-Open No. 2003-174172 for example, where the carriers are extracted from an end of the channel region in a gate width direction or in a source-tie structure, when gate width is long, the effect of extracting the carriers stored in the channel region is reduced even though the carriers are extracted from both ends. Hence, applying such structures to devices with an extremely large gate width is difficult.

When a conventional semiconductor device having a source-tie structure is an nMOS device, a gate electrode is formed on a rectangular semiconductor layer of an SOI substrate, and a gate insulating film is sandwiched therebetween in such a manner that the gate electrode crosses the semiconductor layer. An N-type drain layer is formed on one side of the semiconductor layer and an N-type source layer is formed on the other side, and a P-type channel region is formed in the semiconductor layer below the gate electrode between the source layer and the drain layer. Furthermore, P-type impurity diffusing regions extending in a gate length direction and having a concentration higher than that in the channel region are formed at a plurality of positions in the channel region, in the gate width direction. P-type body contact regions which extend in a gate length direction, are respectively connected with the impurity diffusing regions and have a concentration higher than that of the impurity diffusing regions, and are formed in the source layer to form a comb-like source-tie structure. Carriers stored in the channel region are thus extracted by means of this structure, which is shown and described in Japanese Patent Application Laid-open No. 2003-17472, particularly on page 9, paragraph 0071 to page 10, paragraph 0078, and in FIGS. 13 and 14.

However, in the conventional technology, the P-type impurity diffusing regions extending in the gate length direction and having a concentration higher than that of the channel region, are formed at a plurality of positions in the P-type channel region along the gate width direction. The P-type body contact regions which extend in the gate length direction are respectively connected with the impurity diffusing regions and have a concentration higher than that of the impurity diffusing regions, and are formed on the source layer side, thereby forming the source-tie structure. A resist mask used to form the impurity diffusing layers which are the same conductivity type as the channel region, and a resist mask used to form the gate electrode, must be accurately positioned. If alignment displacement occurs during superpositioning of the resist masks such that the impurity diffusing layers are shifted to the drain layer side, there arises a problem that punch-through occurs, and consequently drain current cannot be controlled using gate voltage. If the masks are designed in advance primarily to avoid alignment displacement during superpositioning of the resist masks, reduction of gate length is difficult, and the semiconductor device is disadvantageously increased in size.

Additionally, a sidewall is generally formed on a side surface of a gate electrode. An insulating material such as a silicon oxide ($SiO_2$) or a silicon nitride ($Si_3N_4$) used to form the sidewall is deposited on the semiconductor layer. The insulating material and the gate insulating film are anisotropically etched to expose an upper surface of the gate electrode and an upper surface of the semiconductor layer, thereby forming the sidewall. In this case, there arises a problem that too much of the upper surface of the gate electrode may be removed due to over-etching. A film thickness of the body contact regions which are the same conductivity type as the channel region and formed on the source layer side is thus reduced, parasitic resistance is increased, and the effect of extracting the carriers stored in the channel region is reduced. This becomes particularly prominent in case of the SOI substrate in which film thickness of the semiconductor layer is small.

SUMMARY OF THE INVENTION

In order to solve this problem, it is an object of the present invention to provide means which can reduce a semiconductor device in size without degrading an effect of extracting a carrier stored in a channel region.

To achieve this object, according to the present invention, there is provided a semiconductor device including a semiconductor layer on an insulating layer, the semiconductor layer surrounded by a device isolating layer; a gate insulating film on the semiconductor layer; a gate electrode having comb-like shape on the gate insulating film, the gate electrode including a base portion extending in a first direction and a plurality of tooth portions extending in a second direction from one side surface of the base portion; a diffusion layer of first conductivity type having comb-like shape in the semiconductor layer under the gate electrode, the gate insulating film sandwiched between the diffusion layer and the gate electrode; a source layer of second conductivity type and having high impurity concentration in the semiconductor layer on a tooth portion side of the base portion of the gate electrode, the second conductivity type opposite the first conductivity type; a drain layer of the second conductivity type and having high impurity concentration in the semiconductor layer on a side of the base portion of the gate electrode opposite the tooth portion side, the first and second directions respectively corresponding to a gate width direction and a gate length direction of the gate electrode; and an extraction layer of the first conductivity type in the semiconductor layer between the source layer and the device isolating layer, the extraction layer having a high impurity concentration greater than an impurity concentration of the diffusion layer and connected with the diffusion layer below the tooth portions of the gate electrode.

To achieve this object, according to the present invention, there is also provided a manufacturing method of a semiconductor device, including diffusing an impurity of a first conductivity type into a substrate to provide a semiconductor layer having a low impurity concentration, the substrate on an insulating layer; forming a device isolating layer to surround the semiconductor layer; forming a gate insulating film on the semiconductor layer; forming a gate electrode of comb-like shape on the gate insulating film, the gate electrode including a base portion extending in a first direction and a plurality of tooth portions extending in a second direction from one side surface of the base portion; diffusing an impurity of a second conductivity type opposite the first conductivity type into the semiconductor layer on a tooth portion side of the base portion of the gate electrode and into the semiconductor layer on a side of the base portion opposite the tooth portion side of the base portion of the gate electrode, to respectively form a source layer and a drain layer having high impurity concentration, the first and second directions respectively corresponding to a gate width direction and a gate length direction of the gate electrode; and diffusing an impurity of the first conductivity type into the semiconductor layer between the source layer and the device isolating layer, to form an extraction layer connected with the semiconductor layer below the tooth portions of the gate electrode, the extraction layer having a high impurity concentration greater than the low impurity concentration of the semiconductor layer.

As a result, according to the present invention, the tooth portions of the low-concentration diffusion layer formed into the comb-like shape function as extraction paths, the carriers stored in the channel region (the peak portion of the low-concentration diffusion layer) can be readily extracted to the extraction layer through the tooth portions, and the single latch-up phenomenon or the kink phenomenon that occurs due to the substrate floating effect can be greatly suppressed. Additionally, since only one resist mask is required to form the gate electrode, the low-concentration diffusion layer can be formed in a self-aligning manner, and the gate length can be reduced to the maximum without considering alignment displacement of the resist mask as an overriding mask design consideration, thereby obtaining an effect of reducing the semiconductor device in size.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

The present invention will now be described by way of preferred, but non-limiting, embodiments of the invention. The referenced drawings are presented for illustrative purposes only, and are not intended to limit the scope of the invention.

Figure 1:
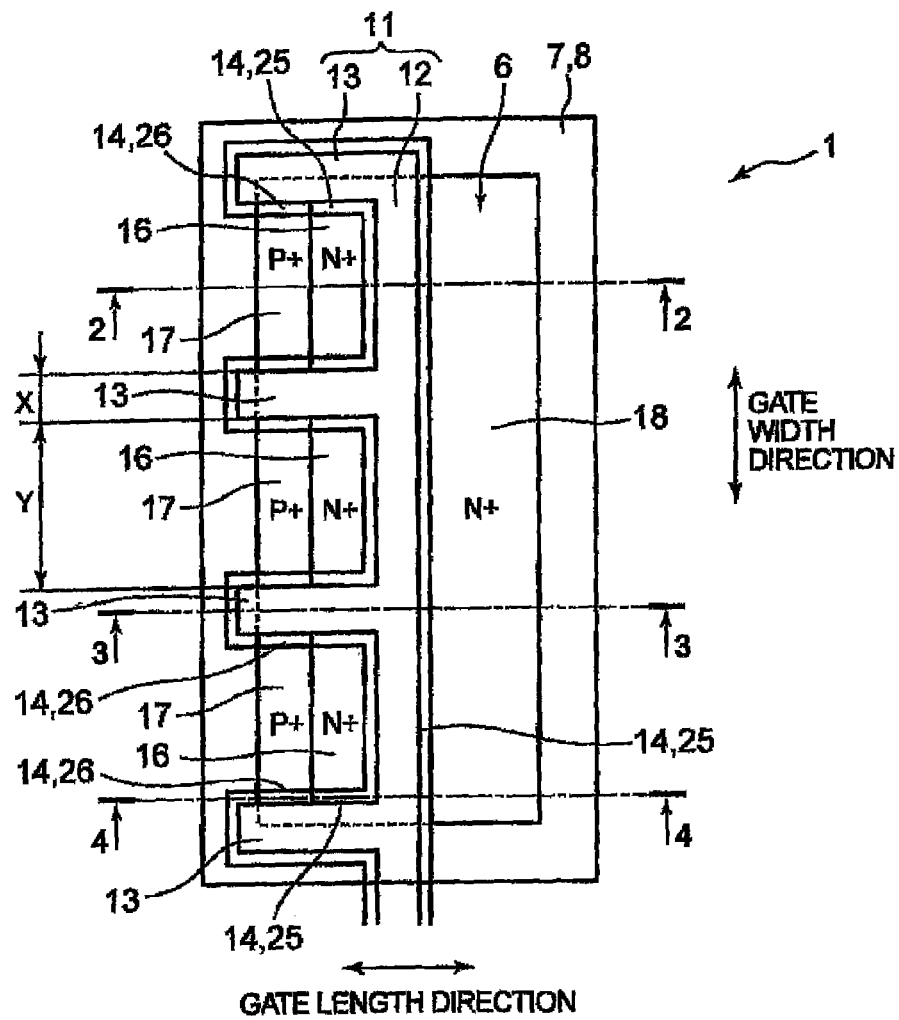
FIG. 1 is an explanatory drawing showing a top face of an nMOS device according to an embodiment.
Figure 2:
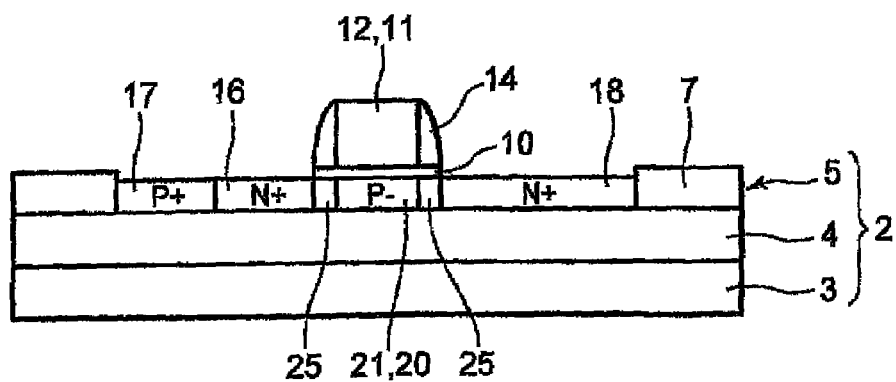
FIG. 2 is an explanatory drawing showing a cross section taken along cross-sectional line 2-2 in FIG. 1.
Figure 3:
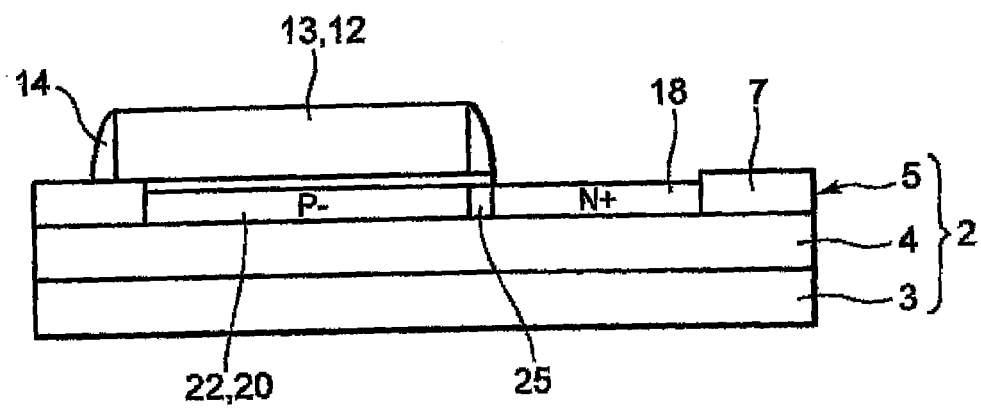
FIG. 3 is an explanatory drawing showing a cross section taken along cross-sectional line 3-3 in FIG. 1.
Figure 4:
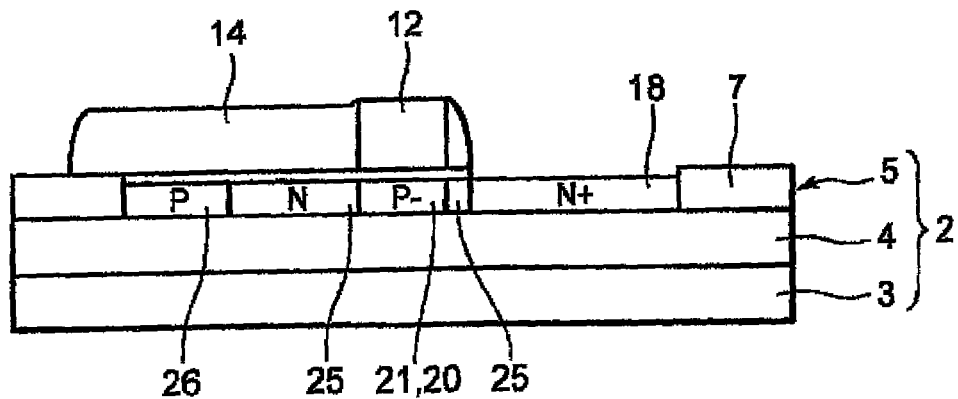
FIG. 4 is an explanatory drawing showing a cross section taken along cross-sectional line 4-4 in FIG. 1.

FIG. 1 is an explanatory drawing showing a top face of an nMOS device according to one or more embodiments of the present invention. FIG. 2 is an explanatory drawing showing a cross section taken along cross-sectional line 2-2 in FIG. 1. FIG. 3 is an explanatory drawing showing a cross section taken along cross-sectional line 3-3 in FIG. 1. FIG. 4 is an explanatory drawing showing a cross section taken along cross-sectional line 4-4 in FIG. 1. FIGS. 5A-5E, 6A-6E, and 7A-7E are explanatory drawings showing a manufacturing method of an nMOS device according to the one or more embodiments of the present invention. It is to be understood that FIGS. 5A-5E show the same cross sections of the device as in FIG. 2, FIGS. 6A-6E show the same cross sections of the device as in FIG. 3, and FIGS. 7A-7E show the same cross sections of the device as in FIG. 4.

In FIGS. 1 to 3, reference numeral 1 denotes an nMOS device as a semiconductor device. SOI substrate 2 has an SOI structure including silicon substrate 3, buried oxide film 4 which is a silicon oxide formed on silicon substrate 3 for example, and semiconductor layer 5 which is the single crystal silicon formed on buried oxide film 4.

Figure 5A:
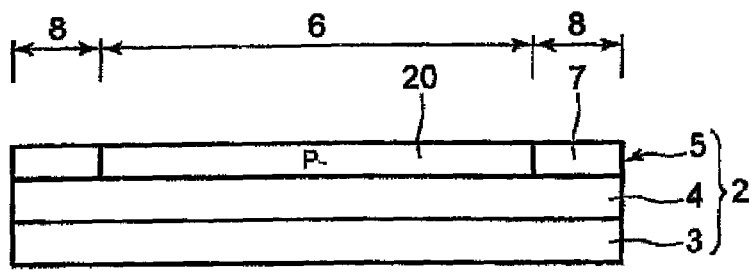
FIGS. 5A-5E are explanatory drawings showing a manufacturing method of an nMOS device according to an embodiment.
Figure 6A:
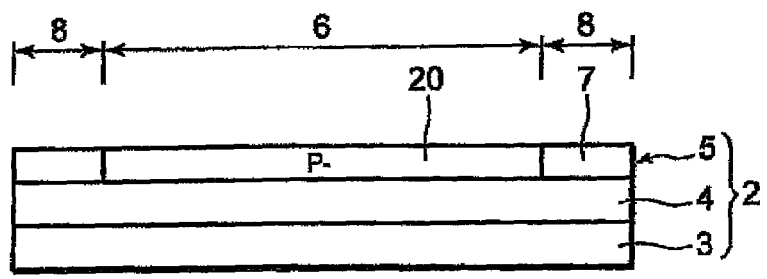
FIGS. 6A-6E are explanatory drawings showing a manufacturing method of an nMOS device according to an embodiment.
Figure 7A:
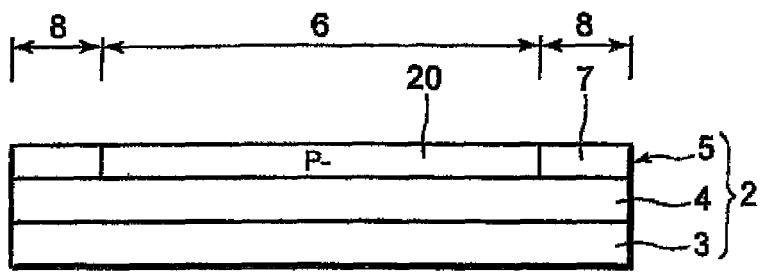
FIGS. 7A-7E are explanatory drawings showing a manufacturing method of an nMOS device according to an embodiment.

Semiconductor layer 5 is shown particularly in FIGS. 5A, 6A and 7A as including device forming region 6 where the semiconductor device is formed, and device isolating region 8 where device isolating layer 7 which surrounds device forming region 6 is formed. Device isolating layer 7 is an insulating material such as a silicon oxide formed in semiconductor layer 5 at device isolating region 8, and extends down to buried oxide film 4. Device isolating layer 7 electrically insulates adjacent device forming regions 6 from each other within the semiconductor layer 5.

Gate insulating film 10 is an insulating material such as a silicon oxide that is relatively thin and which is formed on semiconductor layer 5 in device forming region 6. Gate electrode 11 is formed to face semiconductor layer 5 in device forming region 6. Gate insulating film 10 is sandwiched between gate electrode 11 and semiconductor layer 5. Gate electrode 11 may be made of polysilicon for example, in which an N-type impurity such as phosphorous (P) or arsenic (As) as a second electroconductive type impurity is diffused with a relatively high concentration. Gate electrode 11 is formed as having a comb-like shape including a peak or base portion 12 which is formed at a central part of the device forming region 6 and which extends in a gate width direction as shown in FIG. 1, and as having a plurality of tooth portions 13 extending in the gate length direction from one side surface of peak or base portion 12, that is the side surface over source layer 16 as will be subsequently explained. Sidewall 14 made of an insulating material such as a silicon oxide or a silicon nitride is formed on a circumferential side surface of the gate electrode 11.

The peak portion 12 of the gate electrode 11 according to this embodiment is formed to extend in the gate width direction to the upper side of the device isolating layer 7 beyond the entire length of the device forming region 6, as shown in FIG. 1. Further, each tooth portion 13 is formed to extend in the gate length direction from the side surface of peak portion 12 to overlap onto device isolating layer 7, with its length in the gate width direction designated as dimension X (also referred to as a tooth portion width X) as shown in FIG. 1. The tooth portions 13 are formed at both ends of the peak portion 12 in the gate width direction, and at a plurality of positions between both ends with an interval between tooth portions 13 designated as a dimension Y (also referred to as a tooth portion interval Y), as further shown in FIG. 1.

In semiconductor layer 5 on the tooth portion 13 side of peak portion 12 of gate electrode 11, a source layer 16 in which an N-type impurity is diffused with high concentration is formed, as also shown in FIG. 1. Also, an extraction layer 17 in which a P-type impurity, such as boron (B) as a first electroconductive type impurity opposite to N type, is diffused with a high concentration between the source layer 16 and the device isolating layer 7. Source layer 16 and extraction layer 17 are formed adjacent to each other. A drain layer 18 in which N-type impurity is diffused with a high concentration is formed in the semiconductor layer 5 on the side of peak portion 12 of gate electrode 11 that is opposite tooth portions 13.

As further shown in FIGS. 2-4 and as should be further understood in view of FIG. 1, a low-concentration diffusion layer 20 having P-type impurity is diffused into semiconductor layer 5 as facing gate electrode 11 and as having the same comb-like shape as the gate electrode 11. Gate insulating film 10 is sandwiched between low-concentration diffusion layer 20 and gate electrode 11. A peak or base portion 21 of the low-concentration diffusion layer 20 functions as a channel region where a channel of the nMOS device 1 is formed. A distal end of each tooth portion 22 of the low-concentration diffusion layer 20 is connected with the extraction layer 17, and functions as an extraction path through which carriers stored in the channel region are led to extraction layer 17.

Below sidewall 14 as shown in FIG. 2 for instance, an N-type LDD (Lightly Doped Drain) portion 25 as an N-type medium-concentration diffusion layer of the source layer 16 is formed in the semiconductor layer 5 (a U-shaped region depicted in FIG. 1) between the source layer 16 and the peak portion 21, and between source layer 16 and the tooth portions 22 of the low-concentration diffusion layer 20, below the gate electrode 11. An N-type LDD portion 25 of the drain layer 18 is formed in the semiconductor layer 5 between the drain layer 18 and the peak portion 21 of the low-concentration diffusion layer 20, below the gate electrode 11. Each N-type LDD portion 25 is formed by diffusing an N-type impurity with a concentration lower than that in the source layer 16 or the drain layer 18.

Moreover, below the sidewall 14, a P-type LDD portion 26 as a P-type medium-concentration diffusion layer is formed in the semiconductor layer 5 as shown generally in FIG. 1, between the extraction layer 17 and the tooth portions 22 of the low-concentration diffusion layer 20 below the gate electrode 11. The P-type LDD portion 26 is also shown in FIG. 4, and is formed by diffusing P-type impurity therein with a concentration lower than that in the extraction layer 17 and higher than that in the low-concentration diffusion layer 20.

It is to be understood that the gate length direction depicted in FIG. 1 means a direction extending from the source layer 16 toward the drain layer 18 parallel with the top or upper face of the SOI substrate 2, and the gate width direction means a direction which is perpendicular to the gate length direction parallel with the top or upper face of the SOI substrate 2.

Figure 5B:
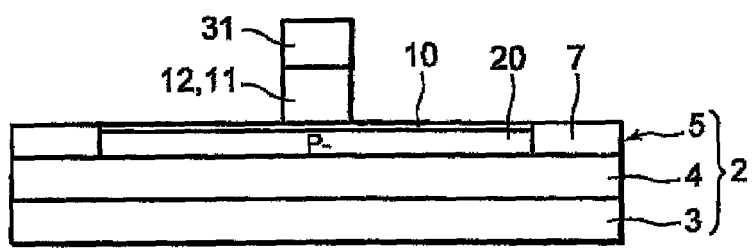
Figure 6B:
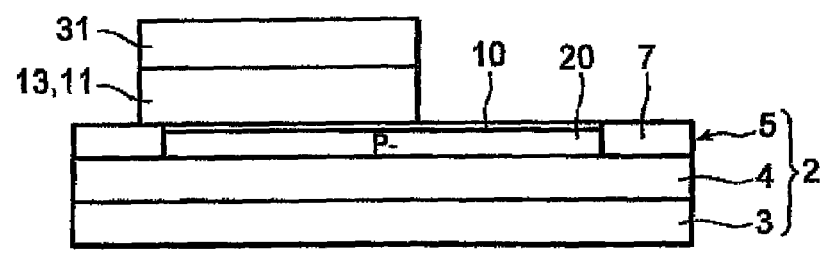
Figure 7B:
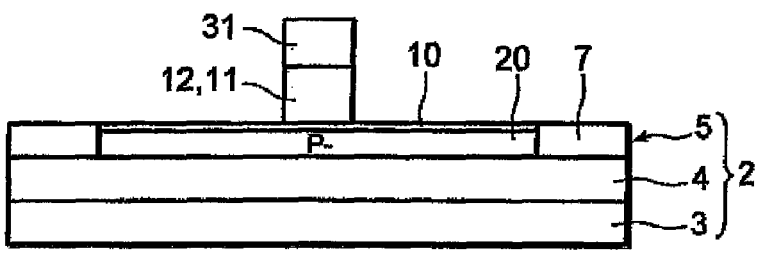

In FIGS. 5B, 6B and 7B, reference numeral 31 denotes a resist mask as a mask member, which has a mask pattern formed by exposing and developing a positive type or negative type resist applied to the SOI substrate 2, using well known photolithography. The resist mask 31 functions as a mask for etching or ion implantation.

A manufacturing method of the nMOS device according to this one or more embodiments will now be explained with reference to steps depicted in FIGS. 5A-5E, 6A-6E and 7A-7E. It is to be understood that steps in FIGS. 5A, 6A and 7A are carried out simultaneously, that steps in FIGS. 5B, 6B and 7B are carried out simultaneously, and the steps in the other corresponding designated figures are likewise respectively carried out simultaneously.

With reference to FIGS. 5A, 6A and 7A, the device forming region 6 and the device isolating region 8 surrounding the periphery of the device forming region 6 are designated on semiconductor layer 5 of SOI substrate 2. Semiconductor layer 5 is a thin silicon layer (about 40 nm) and is formed above silicon substrate 3, with buried oxide film 4 sandwiched therebetween. Device isolating layer 7 made of a silicon oxide is formed in the device isolating region 8 in the semiconductor layer 5 of SOI substrate 2, using an STI (Shallow Trench Isolation) method. A P-type impurity ion is implanted into semiconductor layer 5 in the device forming region 6 surrounded by the device isolating layer 7 for control of threshold voltage, thereby forming the low-concentration diffusion layer 20 in which the P-type impurity is diffused with a relatively low concentration.

With reference to FIGS. 5B, 6B and 7B, the top face of semiconductor layer 5 in the device forming region 6 is thermally oxidized using a thermal oxidation method to form the gate insulating film 10. Polysilicon, which is used to form the gate electrode 11, is deposited on the gate insulating film 10 and the device isolating layer 7 using a CVD (Chemical Vapor Deposition) method to form a polysilicon film. Resist mask 31 is formed on the polysilicon film using photolithography to cover a region where the comb-shaped gate electrode 11 is to be formed. The exposed polysilicon film not covered by resist mask 31 is anisotropically etched to expose the gate insulating film 10 in the device forming region 6 and device isolating layer 7 in the device isolating region 8, thereby forming the comb-shaped gate electrode 11 which is above and faces the low-concentration diffusion layer 20 in semiconductor layer 5. As explained previously, gate insulating film 10 is sandwiched between comb-shaped gate electrode 11 and low-concentration diffusion layer 20. Comb-shaped gate electrode 11 includes the peak portion 12 and the plurality of tooth portions 13.

Figure 5C:
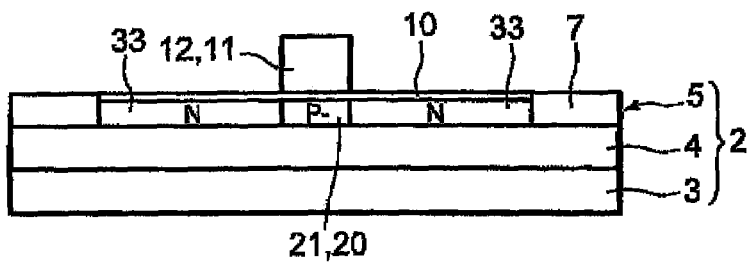
Figure 6C:
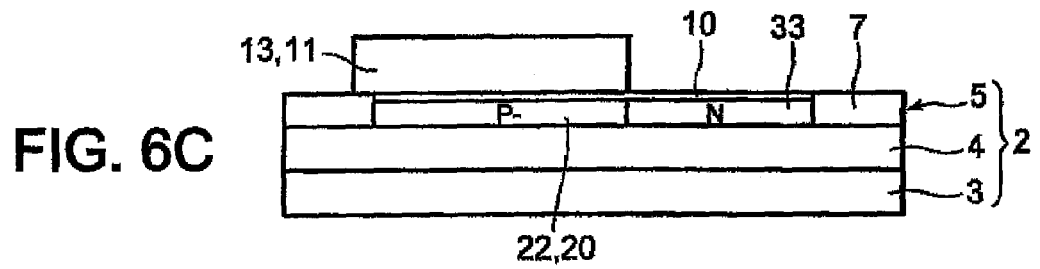
Figure 7C:
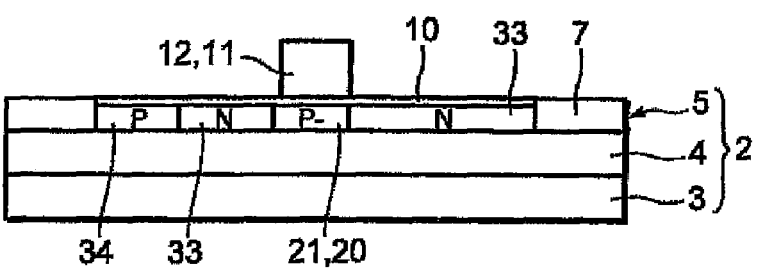

With reference to FIGS. 5C, 6C and 7C, the resist mask 31 formed as above-described is removed, and the gate electrode 11 is used as a mask during implant of an N-type impurity ion into the semiconductor layer 5 below the gate insulating film 10. An N-type diffusion layer 33 having N-type impurity diffused therein with a concentration equivalent to N-type LDD portions 25 and lower than the subsequently formed source layer 16 and drain layer 18 is thus formed in the semiconductor layer 5, except for under gate electrode 11. As a result, the comb-shaped low-concentration diffusion layer 20 including the peak portion 21 and the plurality of tooth portions 22 having shape similar to the gate electrode 11, is formed in the semiconductor layer 5 below the gate electrode 11 in a self-aligning manner.

Subsequently, another resist mask (not shown) is formed on semiconductor layer 5 using well-known photolithography wherein the gate insulating film 10 in regions where the P-type LDD portion 26 and the extraction layer 17 are to be formed are exposed from the another resist mask. This another resist mask is used during implant of P-type impurity ions in the semiconductor layer 5 below the gate insulating film 10, thereby forming a P-type diffusion layer 34 corresponding to the P-type LDD portion 26 and as having P-type impurity diffused therein at a concentration lower than that in extraction layer 17 and higher than that in low-concentration diffusion layer 20.

Figure 5D:
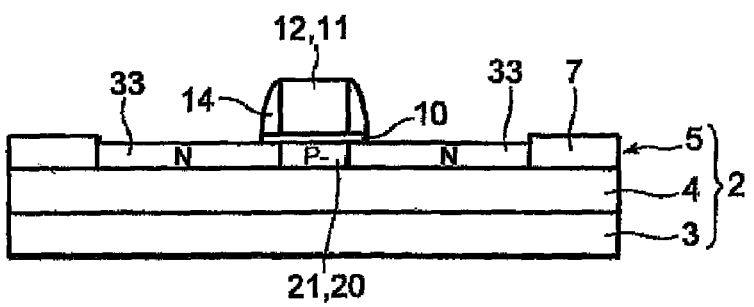
Figure 6D:
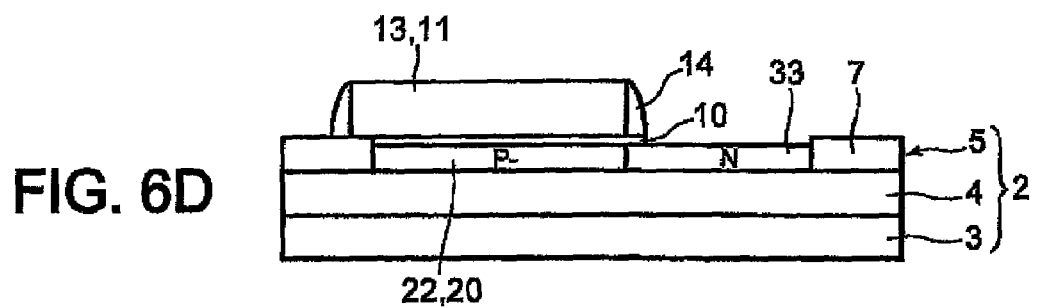
Figure 7D:
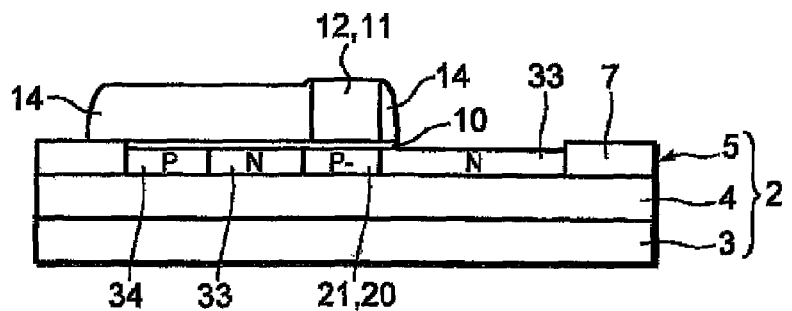

With reference to FIGS. 5D, 6D and 7D, a silicon oxide is deposited on the entire surface of the SOI substrate 2, that is on the upper sides of the gate electrode 11 and the gate insulating film 10 using a CVD method, to form a silicon oxide film. The silicon oxide film and the gate insulating film 10 are anisotropically etched, thereby exposing the top face of the gate electrode 11 and the top face of the semiconductor layer 5. Sidewall 14 is thereby formed on the side surface of the gate electrode 11. At this time, approximately 5 to 10 nm of the top face of semiconductor layer 5 is removed due to over-etching.

Figure 5E:
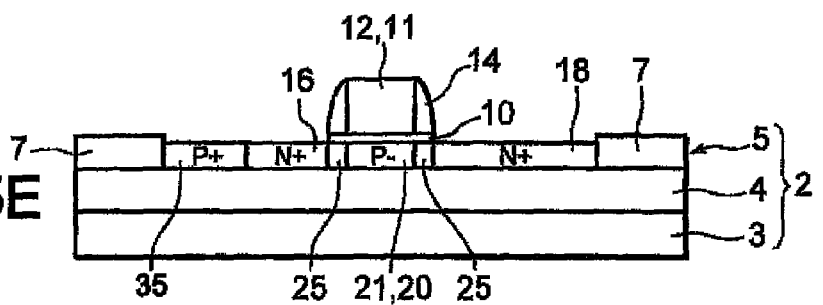
Figure 6E:
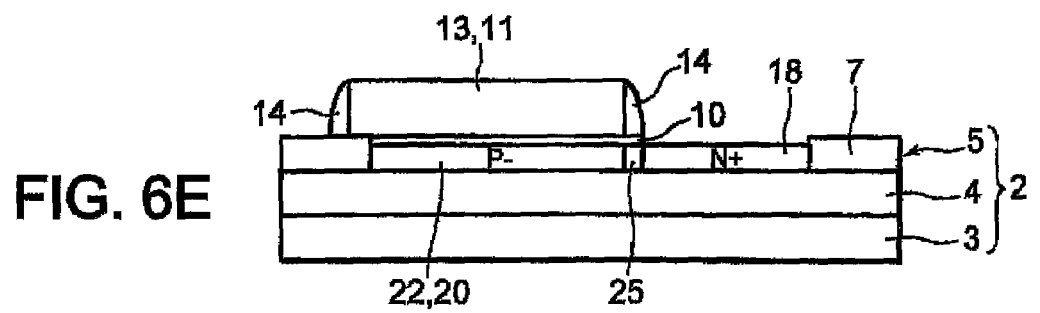
Figure 7E:
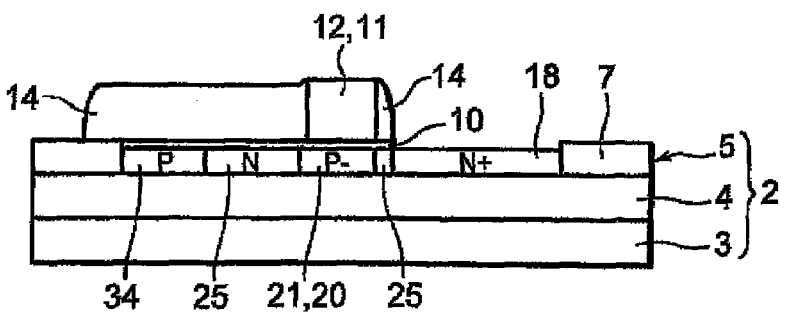

With reference to FIGS. 5E, 6E and 7E, a further resist mask (not shown) is formed using well-known photolighography, to cover the region in device forming region 6 in which the extraction layer 17 is to be formed, and N-type impurity ions are implanted into the exposed semiconductor layer 5 using this further resist mask, the gate electrode 11, and the sidewall 14 as masks. Thus, the source layer 16 and the drain layer 18 in which N-type impurity is diffused with a relatively high concentration are formed on the tooth portion 13 side of the peak portion 12 of gate electrode 11, and the side of peak portion 12 opposite the tooth portion 13 side.

Thereafter, the further resist mask formed as above-explained is removed, and a still further resist mask (not shown) is formed using well known photolithography, to expose the region of device forming region 6 in which the extraction layer 17 is to be formed. P-type impurity ions are implanted into the exposed semiconductor layer 5 using this still further resist mask, and the extraction layer 17 (depicted as diffusion layer 35 in FIG. 5E) which is connected with the distal end of each tooth portion 22 of the low-concentration diffusion layer 20 and which has P-type impurity diffused therein with a relatively high concentration is thus formed between the source layer 16 and the device isolating layer 7. The still further resist mask is then removed, thereby forming the nMOS device 1 depicted in FIGS. 1 to 4.

After this nMOS device 1 is formed as described above, a silicide layer (not shown) is formed on top faces of the extraction layer 17, the source layer 16, and the drain layer 18 of FIG. 1, using salicide processing. After the silicide layer is formed, an interlayer insulating film made of an insulating material is formed on the entire surface of the structure. After the interlayer insulating film is formed, contacts or the like which are respectively electrically connected with the silicide layer and the gate electrode 11 are formed in the extraction layer 17, the source layer 16, and the drain layer 18.

In the thus formed nMOS device 1 of FIG. 1, the low-concentration diffusion layer 20 having the comb-like shape with the peak portion 21 and the tooth portions 22 is formed on the source layer 16 side of the semiconductor layer 5 below the gate electrode 11, as shown in FIG. 3. The distal ends of the tooth portions 22 are connected with the extraction layer 17 via the P-type LDD portion 26. Therefore, holes produced due to impact ions at the drain layer 18 end of the peak portion 21 (channel region) of the low-concentration diffusion layer 20 can be readily extracted through the tooth portions 22 of the low-concentration diffusion layer 20 to the extraction layer 17, which is connected with the distal ends of the tooth portions 22 via the P-type LDD portion 26. The extracted holes at extraction layer 17 are led to the outside by the contacts connected with the source layer 16 through the common silicide layer, thereby suppressing the substrate floating effect.

This embodiment includes the steps of diffusing the P-type impurity to form the P-type diffusion layer 35 (the extraction layer 17) and to form the P-type LDD portion 26, in addition to the steps of diffusing the N-type impurity to form the N-type diffusion layer 33, the source layer 16, the drain layer 18, and the N-type LDD portion 25. It would thus appear that an increased number of steps is necessary. However, since a pMOS device is also simultaneously formed on the SOI substrate according to this embodiment, the steps of diffusing the P-type impurity to form the source layer, the drain layer, and the LDD portions of the pMOS device can function as the steps of diffusing the P-type impurity in the above described nMOS device, and hence the number of step is not increased.

Figure 8:
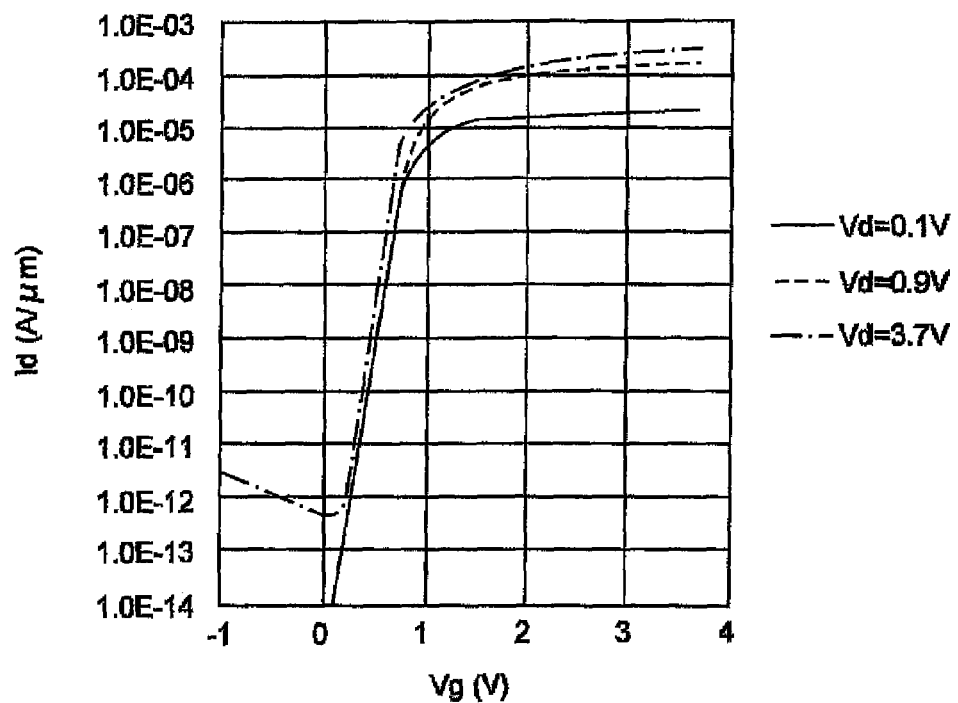
FIG. 8 is a graph showing Id-Vg characteristics of an nMOS device according to an embodiment.
Figure 9:
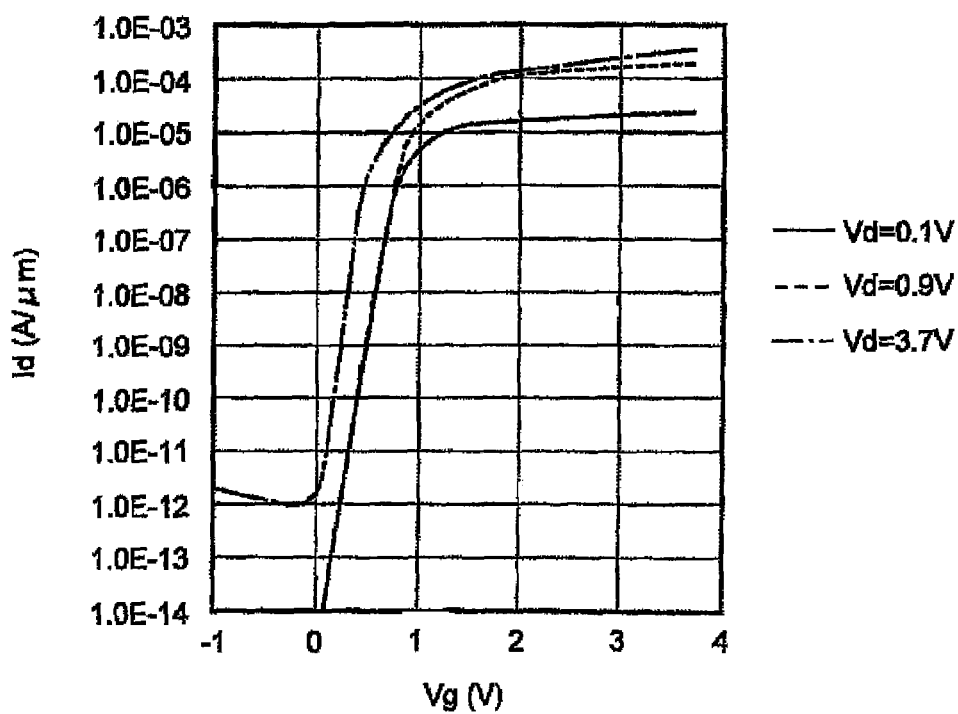
FIG. 9 is a graph showing Id-Vg characteristics of an nMOS device having a regular floating structure.

FIG. 8 is a graph showing Id/Vg characteristics of the nMOS device 1 having a source-tie structure. FIG. 9 is a graph showing Id–Vg characteristics of an nMOS device having a regular floating structure. It is to be understood that a gate length L of the gate electrode 11 (the peak portion 12) of the nMOS device 1 considered with respect to FIG. 8 is 0.5 µm, a gate width W of the same is 50 µm, a tooth portion interval Y of the tooth portions 13 is 2 µm, a tooth portion width X is 0.3 µm, and a film thickness of the gate insulating film 10 is 7 nm. A gate length L of the nMOS device considered with respect to FIG. 9 is 0.5 µm, a gate width W of the same is 50 µm, and a film thickness of the gate insulating film is 7 nm.

The rising characteristics of drain current Id in the floating structure depicted in FIG. 9 are dependent on drain voltage Vd. On the other hand, as shown in FIG. 8, in the nMOS device 1 having the source-tie structure according to FIG. 1, even if the drain voltage Vd is changed, rising characteristics of the drain current Id with respect to a gate voltage Vg are substantially equivalent and stable. It can thus be understood that the single latch-up phenomenon due to the substrate floating effect is greatly suppressed.

Figure 10:
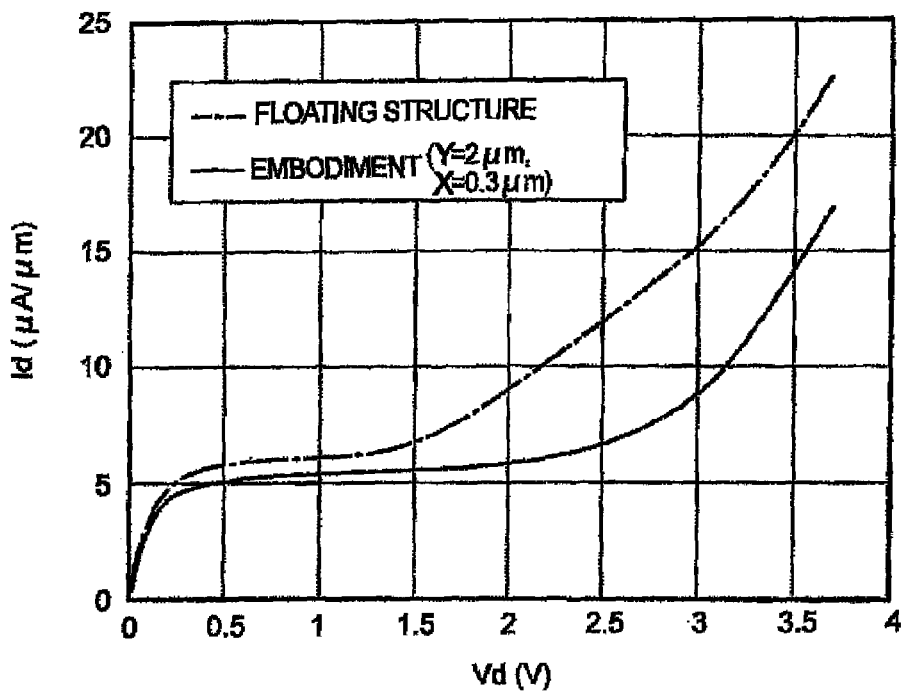
FIG. 10 is a graph showing Id-Vd characteristics of an nMOS device according to an embodiment.

Further, as shown in FIG. 10, in accordance with the Id–Vd characteristics of the nMOS device 1 having the source-tie structure formed with the same specifications noted above and as indicated by the solid line, it can be seen that when the gate voltage Vg is 0.9 V, a region of the drain voltage Vd where the drain current Id is maintained constant is widened. Upon comparison with the Id–Vd characteristics of the nMOS device having the floating structure as indicated by an alternate long and short dash line in FIG. 10, it can be understood that the kink phenomenon due to the substrate floating effect is greatly suppressed in the nMOS device of FIG. 1.

Figure 11:
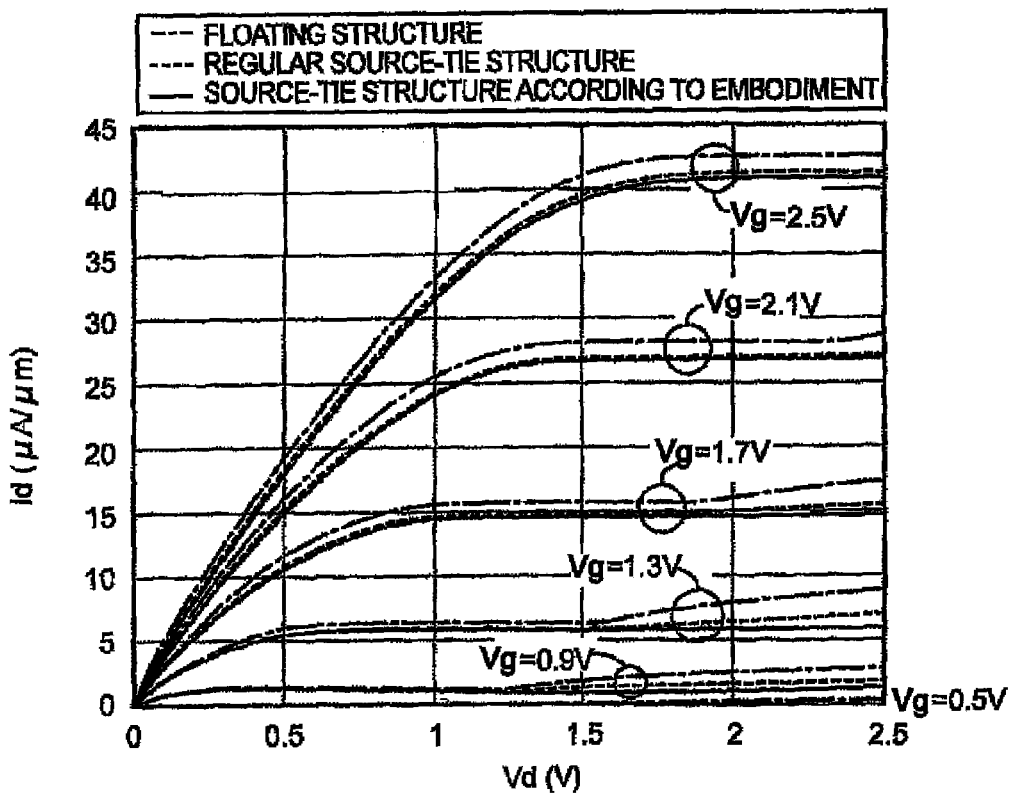
FIG. 11 is a graph showing Id-Vd characteristics of various kinds of nMOS devices.

FIG. 11 is a graph showing Id–Vd characteristics of the nMOS device 1 having the source-tie structure according to this embodiment as indicated by solid line, the nMOS device having the regular source-tie structure as indicated by dashed line, and the nMOS device having the regular floating structure as indicated by alternate long and short dash line. It is to be understood that each nMOS device has gate length L of 10 μm and the gate width W of 50 μm, and the gate insulating film has a film thickness of 2.5 nm. Furthermore, in the nMOS device having the regular source-tie structure, the impurity diffusion layer and the body contact region explained in Japanese Patent Application Laid-Open No. 2003-17473 have the same diffusion concentration of the P-type impurity, and this diffusion concentration is the same as the diffusion concentration in the extraction layer 17 according to FIG. 1 embodiment of the present invention.

As shown in FIG. 11, the nMOS device having the regular source-tie structure has a kink smaller than that in the nMOS device having the regular floating structure. However, comparing with the nMOS device 1 having the source-tie structure according to this embodiment, it can be understood that the kink is large. It can be considered that this phenomenon occurs because semiconductor layer 5 is thinned during formation of the sidewall 14 and a parasitic resistance is thereby increased to weaken the carrier extraction effect.

On the other hand, the tooth portions 22 (the extraction paths) of the low-concentration diffusion layer 20 and the P-type LDD portion 26 according to the embodiment shown in FIG. 1, are formed below the gate electrode 11 and the sidewall 14. Therefore, the thickness of each of these members is not reduced, and the carrier extraction effect can be sufficiently demonstrated, thereby greatly suppressing the substrate floating effect. As a result, the kink is reduced.

As explained above, according to this embodiment shown generally in FIG. 1, the comb-shaped gate electrode 11 is used as a mask to form the comb-like low-concentration diffusion layer 20 in semiconductor layer 5, and the tooth portions 22 function as extraction paths. Therefore, the nMOS device 1 having the source-tie structure superior in the carrier extraction effect can be obtained. Moreover, this superiority is particularly prominent in the region where gate voltage Vg is low, and particularly preferable to a semiconductor device used in an analog circuit.

Additionally, when the gate electrode 11 is formed based on a single photolithography operation, the gate electrode 11 is used as a mask to form the peak portion 21 (the channel region) and the tooth portions 22 (the extraction paths) of the low-concentration diffusion layer 20 in a self-aligning manner. Therefore, mask design does not have to carried out particularly considering alignment displacement during superpositioning of resist masks, and gate length can thus be maximally shortened. The tooth portions 22 of the low-concentration diffusion layer 20 that function as extraction paths according to this embodiment, can be continuously formed with the predetermined tooth portion interval Y and tooth portion width X, the gate width in the source-tie structure can be limited, and a degree of freedom in gate design can be increased, thereby reducing the nMOS device 1 in size.

As explained above, in this embodiment, the gate electrode in the nMOS device is formed as having a comb-like shape including a peak portion extending in the gate width direction, and a plurality of tooth portions extending in the gate length direction from the source layer side of the peak portion. The P-type impurity is diffused to have a low concentration in the semiconductor layer facing the gate electrode, thereby forming the comb-shaped low-concentration diffusion layer. The gate insulating film is sandwiched between the semiconductor layer and the gate electrode. A P-type impurity is diffused with a high concentration in the semiconductor layer between the source layer and the device isolating layer to form an extraction layer which is connected with the tooth portions of the low-concentration diffusion layer through the P-type LDD portion. As a result, the tooth portions of the comb-shaped low-concentration diffusion layer can function as the extraction paths, and holes stored in the peak portion (the channel region) of the low-concentration diffusion layer can be readily extracted to the extraction layer via the tooth portions of the low-concentration diffusion layer and the P-type LDD portion. The single latch-up phenomenon or the kink phenomenon that can occur due to the substrate floating effect can be greatly suppressed, and forming of the resist mask once to form the gate electrode enables forming of the low-concentration diffusion layer in a self-aligning manner. Alignment displacement of the resist masks at the time of superpositioning does not have to be considered as the critical concern at the mask design stage, and the focus can thus be on maximally shortening gate length, thus reducing size of the nMOS device.

It is to be understood that an example has been explained where the tooth portions of the gate electrode are provided at both ends of the peak portion in the gate width direction and at a plurality of positions between both ends in the foregoing embodiment. However, the number of tooth portions provided between both ends is not restricted in number as explained and shown in FIG. 1, and one (three in total) or more can suffice. In short, the number of tooth portions can be determined based on the size of the nMOS device.

Additionally, in the foregoing embodiment the source layer or the drain layer are formed, and then the extraction layer is formed. However, the extraction layer may be formed before the source layer or the drain layer. In short, since the impurity concentration in the extraction layer is the same as the impurity concentration in the source layer or the drain layer of the pMOS device, it is sufficient to determine formation order based on the procedure used when simultaneously forming the pMOS device or a CMOS device in which the nMOS device is combined with the pMOS device on the same SOI substrate.

Further, although semiconductor layer 5 is described as having film thickness of 40 nm in the foregoing embodiment, the same effect can be obtained as long as film thickness of semiconductor layer 5 falls within a range of an industrially producable film thickness (approximately 5 to 200 nm). Furthermore, although the device isolating layer 7 is described as formed using an STI method in the foregoing embodiment, device isolating layer 7 can likewise be made using a LOCOS (Local Oxidation Of Silicon) method.

Moreover, although the semiconductor device of the foregoing embodiment has been described as an nMOS device, the semiconductor device may be a pMOS device. In this case, N-type impurity is used as a first electroconductive impurity, and P-type impurity is used as a second electroconductive impurity. Additionally, in the foregoing embodiment, the SOI substrate has been described as a substrate having an SOI structure in which a semiconductor layer is formed on a silicon substrate, and a buried oxide film as an insulating layer is sandwiched therebetween. However, the substrate is not restricted as having an SOI structure, and may be for example an SOS (Silicon On Sapphire) substrate in which a semiconductor layer is formed on a sapphire substrate as an insulating layer, or an SOQ (Silicon On Quartz) substrate in which a semiconductor layer is formed on a quartz substrate as an insulating layer. These modifications can be made to the embodiment described above while still falling within the scope of the appended claims.

What is claimed is:

1. A semiconductor device comprising:
a semiconductor layer on an insulating layer, the semiconductor layer surrounded by a device isolating layer;
a gate insulating film on the semiconductor layer;
a gate electrode having comb-like shape on the gate insulating film, the gate electrode including a base portion extending in a first direction and a plurality of tooth portions extending in a second direction from one side surface of the base portion;
a diffusion layer of first conductivity type having comb-like shape in the semiconductor layer under the gate electrode, the gate insulating film sandwiched between the diffusion layer and the gate electrode;
a source layer of second conductivity type and having high impurity concentration in the semiconductor layer on a tooth portion side of the base portion of the gate electrode, the second conductivity type opposite the first conductivity type;
a drain layer of the second conductivity type and having high impurity concentration in the semiconductor layer on a side of the base portion of the gate electrode opposite the tooth portion side,
the first and second directions respectively corresponding to a gate width direction and a gate length direction of the gate electrode; and
an extraction layer of the first conductivity type in the semiconductor layer between the source layer and the device isolating layer, the extraction layer having a high impurity concentration greater than an impurity concentration of the diffusion layer and connected with the diffusion layer below the tooth portions of the gate electrode.

2. The semiconductor device according to claim 1, wherein the gate electrode includes three or more of the tooth portions.

3. The semiconductor device according to claim 1, wherein distal ends of the tooth portions of the gate electrode overlap onto the device isolating layer.

4. The semiconductor device according to claim 1, further comprising a sidewall on a side surface of the gate electrode.

5. The semiconductor device according to claim 4, wherein the semiconductor layer below the sidewall and between the extraction layer and the diffusion layer is the first conductivity type and has an impurity concentration lower than the high impurity concentration of the extraction layer, and
the semiconductor layer below the sidewall and between the source layer and the diffusion layer under the gate electrode, and below the sidewall and between the drain layer and the diffusion layer under the gate electrode, is the second conductivity type and has an impurity concentration lower than the high impurity concentration of the source layer and the drain layer.

* * * * *